United States Patent
Chang et al.

(10) Patent No.: US 11,956,947 B2
(45) Date of Patent: Apr. 9, 2024

(54) ONE-TIME PROGRAMMABLE MEMORY DEVICE

(71) Applicant: Taiwan Semiconductor Manufacturing Company, Ltd., Hsinchu (TW)

(72) Inventors: Meng-Sheng Chang, Hsinchu County (TW); Chia-En Huang, Hsinchu County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 309 days.

(21) Appl. No.: 17/407,281

(22) Filed: Aug. 20, 2021

(65) Prior Publication Data

US 2023/0058880 A1 Feb. 23, 2023

(51) Int. Cl.
*H10B 20/20* (2023.01)
(52) U.S. Cl.
CPC .................................. *H10B 20/20* (2023.02)

(58) Field of Classification Search
CPC .............................. H10B 20/20; G11C 11/40
See application file for complete search history.

(56) References Cited

U.S. PATENT DOCUMENTS

| | | | |
|---|---|---|---|
| 9,331,085 B2 * | 5/2016 | Choi | H01L 27/0924 |
| 2018/0033795 A1 * | 2/2018 | Horch | H01L 29/0649 |

* cited by examiner

*Primary Examiner* — Allison Bernstein
(74) *Attorney, Agent, or Firm* — Merchant & Gould P.C.

(57) ABSTRACT

An OTP memory cell is provided. The OTP memory cell includes: an antifuse transistor, wherein a gate terminal of the antifuse transistor is connected to a first word line having a first signal, and the antifuse transistor is selectable between a first state and a second state in response to the first signal; and a selection transistor connected between the antifuse transistor and a bit line, wherein a gate terminal of the selection transistor is connected to a second word line having a second signal, and the selection transistor is configured to provide access to the antifuse transistor in response to the second signal. A first terminal of the antifuse transistor is a vacancy terminal, and a second terminal of the antifuse transistor is connected to the selection transistor.

20 Claims, 9 Drawing Sheets

ONE-TIME PROGRAMMABLE MEMORY DEVICE

BACKGROUND

Many modern-day electronic devices include electronic memory. Electronic memory is a device configured to store bits of data in respective memory cells. A memory cell is a circuit configured to store a bit of data, typically using one or more transistors. One type of electronic memory is one-time programmable (OTP) memory. An OTP memory is a read-only memory that may be programmed (e.g., written to) only once.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
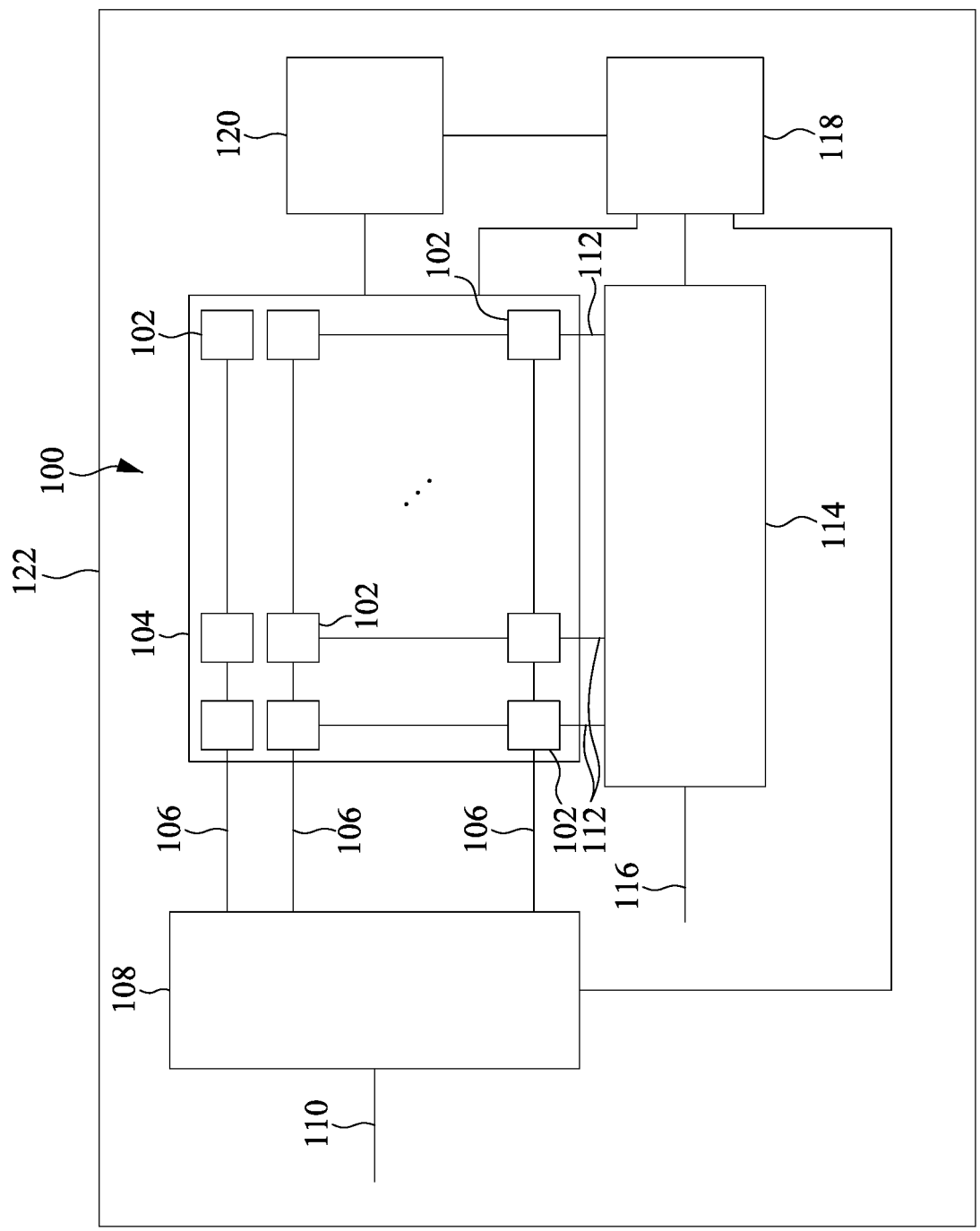
FIG. 1 is a block diagram illustrating an example memory device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One-time programmable (OTP) memory devices include, for example, electrical fuse (eFuse) and antifuse. An eFuse is programmed by electrically blowing a strip of metal or poly with a flow of high-density current using I/O voltage. An antifuse is programmed by electrically shorting the gate and source of a transistor with a dielectric breakdown when a high voltage is applied to the thin gate dielectric layer of the transistor. Examples of gate dielectric materials may include high-k dielectric, silicon dioxide, and silicon oxynitride, though other gate dielectric materials may also be employed. The thickness of the thin gate dielectric layer is lower than the thickness of a regular gate dielectric layer. An antifuse starts with a high resistance state and ends up with a permanent electrically conductive path (i.e., a low resistance state).

Typically, an OTP memory device using antifuse has a two-transistor (2T) per bit arrangement. Specifically, each bit corresponds to a cell. Each cell has a two-transistor structure, including two transistors: an antifuse transistor and a selection transistor. However, one source/drain terminal of the antifuse transistor is a floating terminal (i.e., not connected to any other components). The fabrication process may have relaxed restrictions on a neighboring metal gate strip. As a result, there is a high likelihood of a short being developed, which in turn leads to large leakage current.

In accordance with some disclosed examples, a OTP memory cell is provided. The OTP memory cell includes a antifuse transistor and a selection transistor connected in series. A source/drain terminal of the antifuse transistor that is not connected is a vacancy terminal rather than a floating terminal. A vacancy terminal is a source/drain terminal that does not have a source contact structure or a drain contact structure. In one implementation, the vacancy terminal is fabricated using a metal-over-diffusion (MD) layer mask that does not include an MD pattern at the vacancy terminal such that there is no source contact structure or drain contact structure formed. As a result, the risk of having a short between the gate and vacancy terminal of the antifuse transistor is eliminated, therefore reducing the risk of a large leakage current.

FIG. 1 is a block diagram illustrating an example memory device 100 in which aspects of the disclosure may be practiced in accordance with some embodiments. In the illustrated embodiment, the memory device 100 includes memory cells 102 arranged in rows and columns to form a memory array 104. The memory array 104 can include any suitable number of rows and columns. For example, a memory array 104 may include R rows and C columns, where R is an integer greater than or equal to 1 and C is a number greater than or equal to 2. As will be described in more detail below, in one embodiment, the memory cells 102 are OTP memory cells that include an antifuse transistor and a selection transistor.

Each row of memory cells 102 is operatively connected to one or more word lines (collectively word line 106). The word lines 106 are operatively connected to one or more row select circuits (collectively referred to as row select circuit 108). The row select circuit 108 selects a particular word line 106 based on an address signal received on a signal line 110.

Each column of memory cell 102 is operatively connected to one or more bit lines (collectively bit line 112). The bit lines 112 are operatively connected to one or more column select circuits (collectively referred to as column select circuit 114). The column select circuit 114 selects a particular bit line 112 based on a select signal received on a signal line 116. It should be noted that the arrangement of rows and columns can be different from the illustrated example in FIG. 1 in other embodiments. In other words, each row of memory cells 102 may be operatively connected to one or more bit lines 112, whereas each column of memory cells 102 may be operatively connected to one or more word lines 106.

A processing device 118 is operatively connected to the memory array 104, the row select circuit 108, and the column select circuit 114. The processing device 118 is operable to control one or more operations of the memory array 104, the row select circuit 108, and the column select circuit 114. Any suitable processing device can be used. Example processing devices include, but are not limited to, a central processing unit, a microprocessor, an application specific integrated circuit, a graphics processing unit, a field programmable gate array, etc., or combinations thereof.

A power supply 120 is at least operatively connected to the memory array 104 and the processing device 118. The processing device 118 can cause one or more bias voltages to be applied to the memory cells 102 in the memory array 104.

The processing device 118 and/or the power supply 120 can be disposed in the same circuitry (e.g., the same integrated circuit) as the memory array 104, the row select circuit 108, and the column select circuit 114. Alternatively, the processing device 118 and/or the power supply 120 may be disposed in separate circuitry from the memory array 104, the row select circuit 108, and the column select circuit 114 and be operatively connected to them. In the example of FIG. 1, the memory device 100, the processing device 118, and the power supply 120 are included in an electronic device 122. Example electronic devices include, but are not limited to, a computing device, a television, a camera, and a wearable device.

When the memory cell 102 is being programmed, or when data is read from a memory cell 102, an address for the memory cell is received on the signal line 110. The row select circuit 108 activates or asserts the word line 106 associated with the address. A select signal is received on the signal line 116, and the bit line 112 associated with the select signal is asserted or activated. As such, the memory cell 102 is programmed, or data is read from the memory cell 102.

Figure 2:
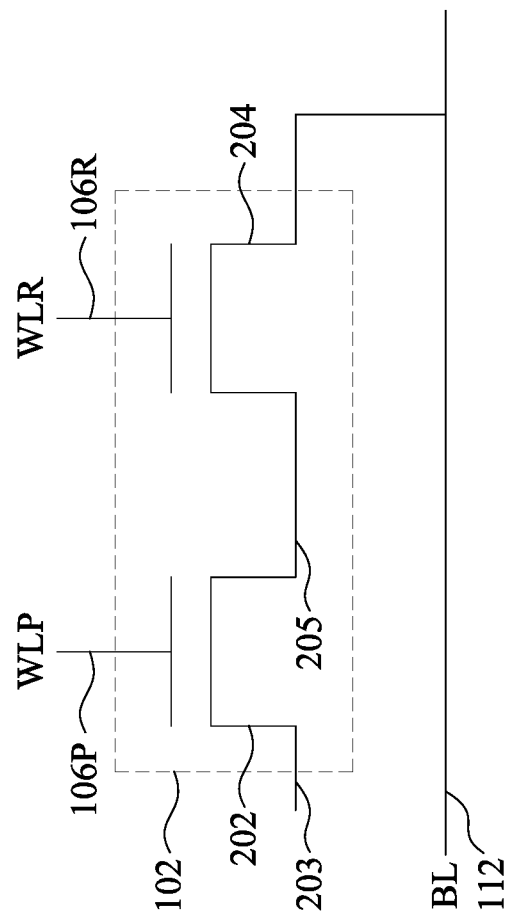
FIG. 2 is a schematic diagram illustrating an OTP memory cell in accordance with some embodiments.

FIG. 2 is a schematic diagram illustrating an OTP memory cell in accordance with some embodiments. The OTP memory cell 102 is formed with a first transistor 202 connected in series with a second transistor 204. In the illustrated example, the first transistor 202 is an antifuse transistor 202, and the second transistor 204 is a selection transistor 204. The thickness of a gate dielectric layer of the antifuse transistor 202 is lower than the thickness of a gate dielectric layer of the selection transistor 204. Any suitable type of transistor can be used. In one embodiment, the antifuse transistor 202 and the selection transistor 204 are metal oxide semiconductor (MOS) transistors. In another embodiment, the antifuse transistor 202 and the selection transistor 204 are fin field-effect transistors (FinFETs). In one embodiment, the antifuse transistor 202 may be n-type, as illustrated in FIG. 2. In another embodiment, the antifuse transistor 202 may be p-type. In one embodiment, the selection transistor 204 may be n-type, as illustrated in FIG. 2. In another embodiment, the selection transistor 204 may be p-type.

In the example of FIG. 2, a gate of the antifuse transistor 202 is connected to a word line 106P and receives a word line program (WLP) signal on the word line 106P. A gate of the selection transistor 204 is connected to another word line 106R and receives a word line read (WLR) signal on the word line 106R. A source or a drain of the selection transistor 204 is connected to a bit line 112. A first terminal 203 of the antifuse transistor 202 is a vacancy terminal, whereas a second terminal 205 of the antifuse transistor 202 is connected to a drain or a source of the selection transistor 204. A vacancy terminal is a source/drain terminal that does not have a source contact structure or a drain contact structure. In one implementation, the vacancy terminal is fabricated using a metal-over-diffusion (MD) layer mask that does not include an MD pattern at the vacancy terminal as discussed further herein below. Details of the vacancy terminal 203 will be described below with reference to FIGS. 3-5. In one embodiment, the vacancy terminal 203 is a source of the antifuse transistor 202. In another embodiment, the vacancy terminal 203 is a drain of the antifuse transistor 202.

During programming, a high voltage is applied to a thin gate dielectric layer of the antifuse transistor 202. As a result, a resultant avalanche breakdown causes the gate and source of the antifuse transistor 202 to be shorted. Thus, the antifuse transistor 202 is in a low resistance state with a permanent electrically conductive path. In the illustrated example, the selection transistor 204 is an n-type transistor. When the WLR signal is at a logical high (i.e., "1"), the selection transistor 204 is turned on. When the bit line 112 is asserted or activated, data is then read from the OTP memory cell 102. In summary, the antifuse transistor 202 is configured to store a first state (e.g., a low resistance state) or a second state (e.g., a high resistance state) in response to the WLP signal provided on a first word line 106P, the selection transistor 204 is configured to provide access to the antifuse transistor 202 in response to a WLR signal provided on a second word line 106R, and the selection transistor 204 is electrically connected to a bit line 112 for sensing the first state or the second state. As such, a bit of data corresponding to the first state or the second state may be programmed in or read from the OTP memory cell 102.

Figure 3:
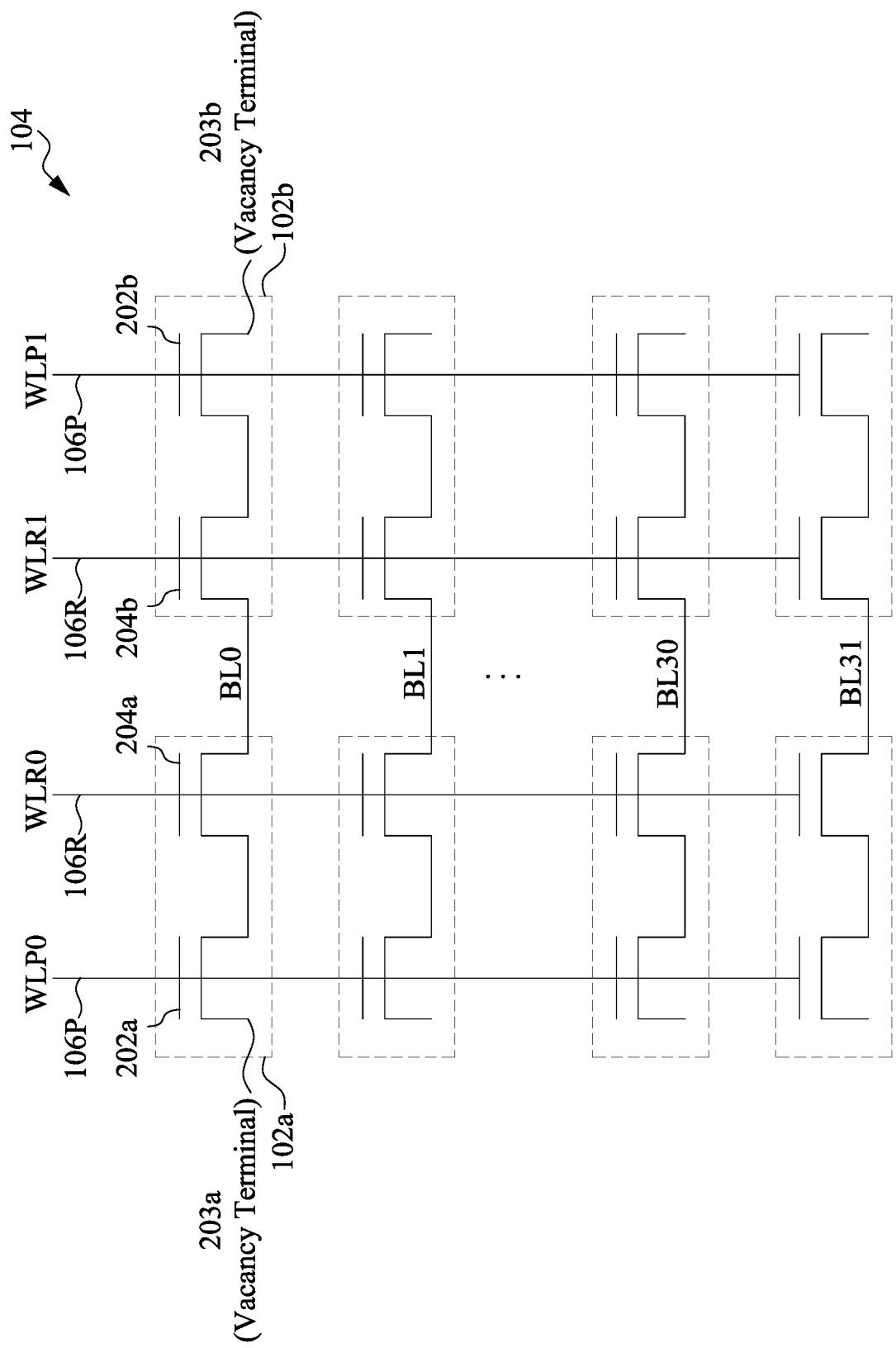
FIG. 3 is a structure diagram of an example memory array in accordance with some embodiments.
Figure 4:
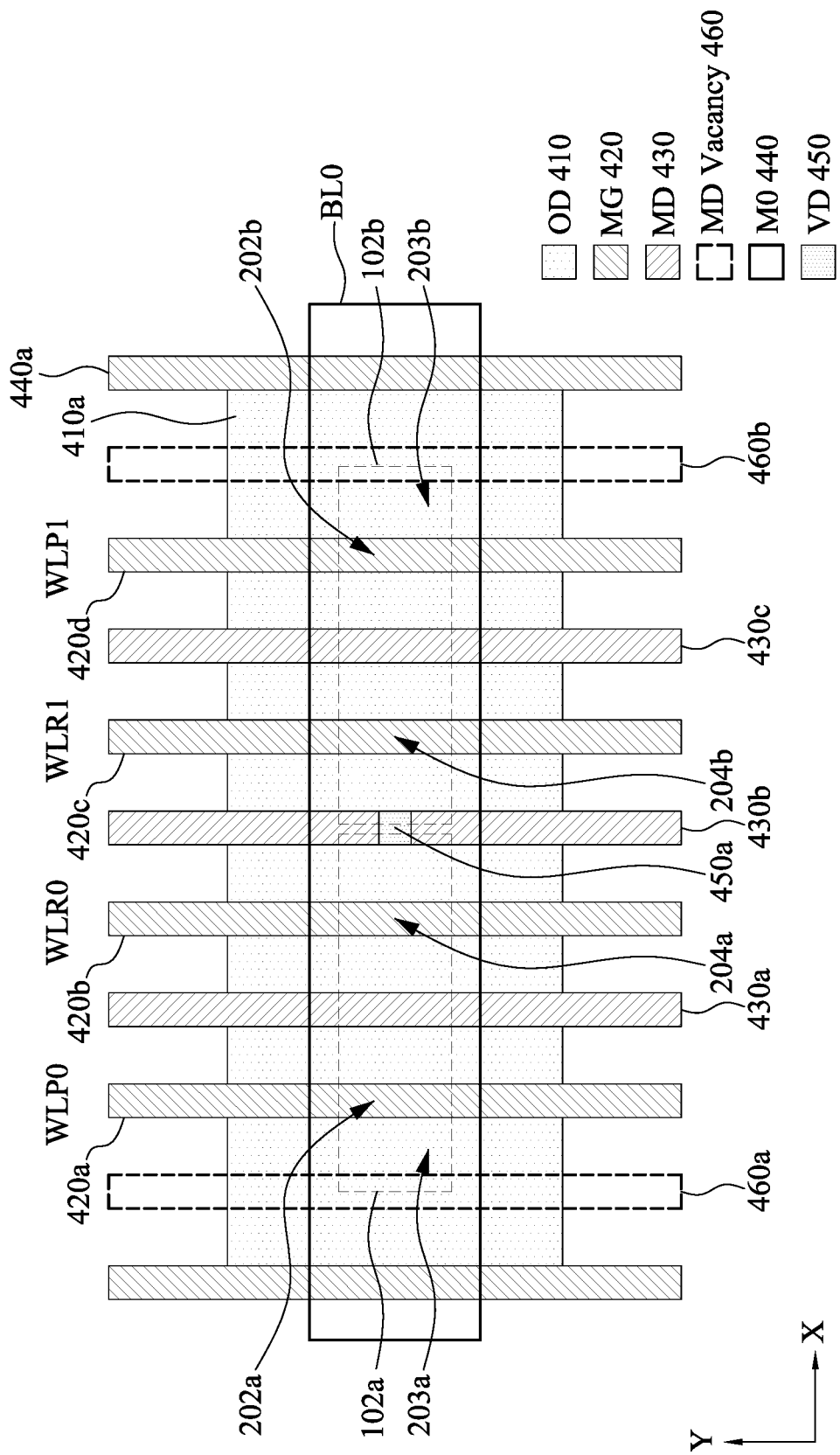
FIG. 4 is a layout diagram of the OTP memory cells of FIG. 3 in accordance with some embodiments.
Figure 5:
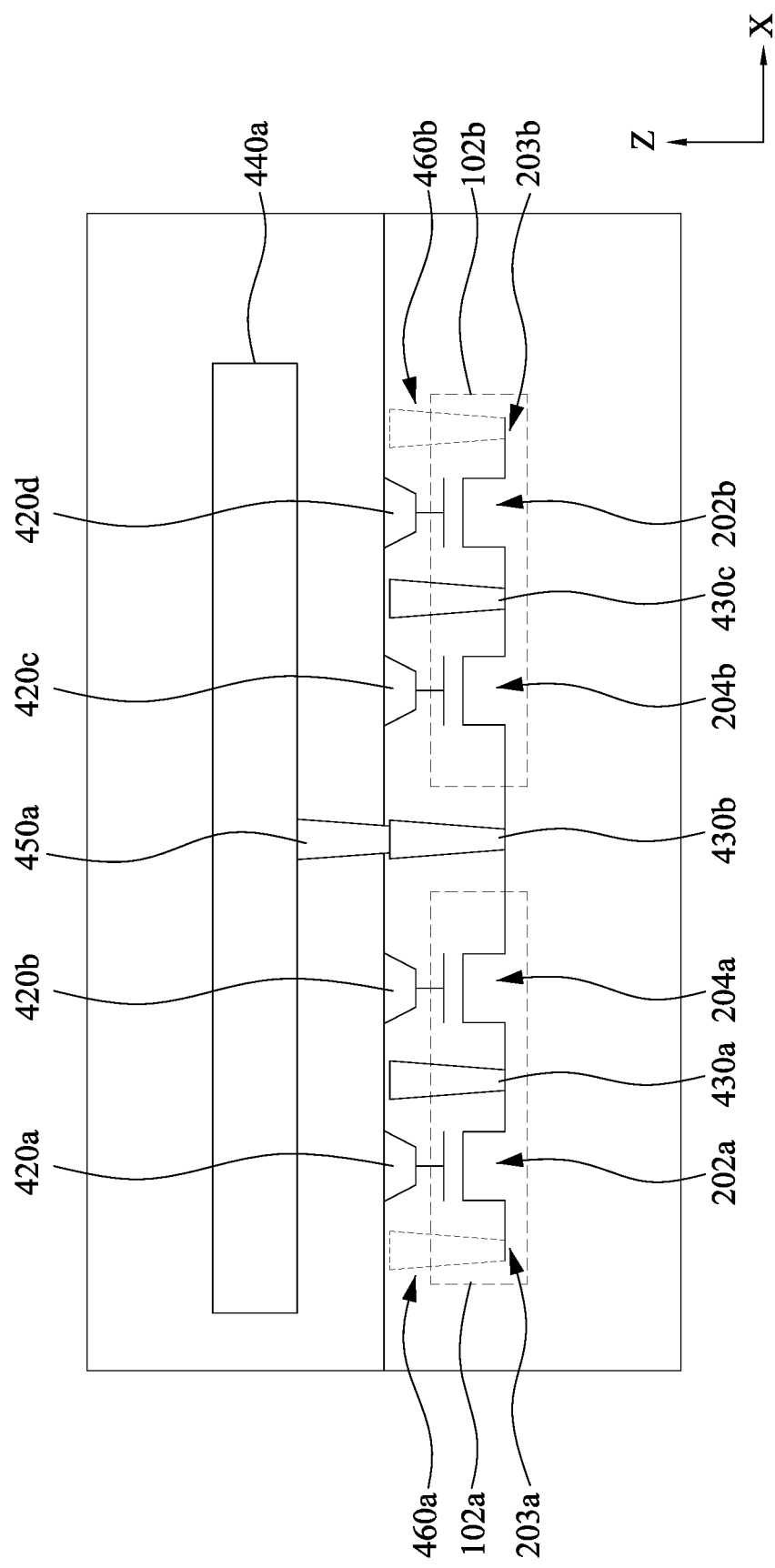
FIG. 5 is a schematic diagram of the OTP memory cells of FIG. 3 in accordance with some embodiments.

FIG. 3 is a structure diagram of an example memory array 104 in accordance with some embodiments. FIG. 4 is a layout diagram of the OTP memory cells 102a and 102b of FIG. 3 in accordance with some embodiments. FIG. 5 is a schematic diagram of the OTP memory cells 102a and 102b of FIG. 3 in accordance with some embodiments. FIG. 3 is described in conjunction with FIG. 4 and FIG. 5. In the illustrated example of FIG. 3, the memory array 104 includes 64 OTP memory cells 102 (collectively 102). The 64 OTP memory cells 102 are arranged in 32 rows and 2 columns. Each of the 64 OTP memory cells 102 has a two-transistor structure, as shown in FIG. 2. Other memory array and memory cell configurations are within the scope of the disclosure.

In the first column, gates of the antifuse transistors of the OTP memory cells are connected to a word line 106P that receives a WLP signal WLP0, while gates of the selection transistors of the OTP memory cells are connected to a word line 106R that receives a WLR signal WLR0. In the second column, gates of antifuse transistors of the OTP memory cells are connected to another word line 106P that receives another WLP signal WLP1, while gates of selection transistors of the OTP memory cells are connected to a word line 106R that receives another WLR signal WLR1.

The arrangement of two cells in each row is the same across all of the 32 rows. The first row is therefore described as an example. In the first row, the OTP memory cells 102a and 102b are connected in series. The selection transistor 204a of the OTP memory cell 102a is connected with the selection transistor 204b of the OTP memory cell 102b. The OTP memory cells 102a and 102b share a bit line (not shown in FIG. 3 for simplicity) that receives a signal BL0. The antifuse transistor 202a of the OTP memory cell 102a is programmed by the WLP signal WLP0, whereas the antifuse transistor 202b of the OTP memory cell 102b is programmed by the WLP signal WLP1.

As stated above, the first terminal 203a of the antifuse transistor 202a is a vacancy terminal, whereas the first terminal 203b of the antifuse transistor 202b is a vacancy terminal as well.

Now referring to FIG. 4, a layout of the OTP memory cells 102a and 102b is illustrated. An active area such as an oxide diffusion (i.e., OD) region 410a (the OD layer is denoted as 410) is disposed on a substrate and extends in the X direction.

Four metal gate (i.e., MG) strips 420a, 420b, 420c, and 420d (the MG layer is denoted as 420) are disposed over the OD region 410a and extend in the Y direction. It should be noted other conductive gate strips are within the scope of the disclosure. The Y direction is perpendicular to the X direction. The metal gate strip 420a serves as the gate metal of the antifuse transistor 202a, and the WLP signal WLP0 can be applied to the metal gate strip 420a. Likewise, the metal gate strip 420b serves as the gate metal of the selection transistor 204a and the WLR signal WLR0 can be applied to the metal gate strip 420b; the metal gate strip 420c serves as the gate metal of the selection transistor 204b and the WLR signal WLR1 can be applied to the metal gate strip 420c; the metal gate strip 420d serves as the gate metal of the antifuse transistor 202b and the WLP signal WLP1 can be applied to the metal gate strip 420d.

Three metal-over-diffusion (i.e., MD) strips 430a, 430b, and 430c (the MD layer is denoted as 430) are disposed over the OD region 410a and extend in the Y direction. The MD strip 430a serves as a source/drain contact structure of both the antifuse transistor 202a and the selection transistor 204a; the MD strip 430c serves as a source/drain contact structure of the antifuse transistor 202b and the selection transistor 204b. The MD strip 430b serves as a source/drain contact structure of the selection transistor 204a and the selection transistor 204b.

The MD vacancy location 460a and the MD vacancy location 460b (collectively 460) correspond to the vacancy terminal 203a and the vacancy terminal 203b, respectively. In a conventional structure, two MD strips are disposed at these two MD vacancy locations 460a and 460b. In that case, as the first terminal 203a of the antifuse transistor 202a and the first terminal 203b of the antifuse transistor 202b are floating terminals, namely terminals that are not connected to any other components, the fabrication process may have relaxed restrictions on the neighboring MG strips 420a and 420d, respectively. As a result, there is a high likelihood of an MD-MG short in that situation. In other words, the MG strip 420a is very likely to be in contact with the MD strip at the MD vacancy location 460a in that case; the MG strip 420d is very likely to be in contact with the MD strip at the MD vacancy location 460b in that case. As a result, the MD-MG short may result in a large leakage current of the OTP memory cell even before the antifuse transistor is programmed, which in turn significantly compromises the functionality of the OTP memory cell. In summary, the floating terminal of the antifuse transistor may lead to an MD-MG short, which may result in a large leakage current of the OTP memory cell.

The MD vacancy location 460a and the MD vacancy location 460b in the example of FIG. 4 can solve the above-identified problem in the conventional structure. The first terminal 203a of the antifuse transistor 202a and the first terminal 203b of the antifuse transistor 202b are vacancy terminals rather than floating terminals. There are no MD strips disposed at the MD vacancy locations 460a and 460b. As such, the risk of having an MD-MG short is eliminated, therefore reducing the risk of a large leakage current.

A metal layer (e.g., M0) strip 440a (the metal layer is denoted as 440) is disposed over the MG layer 420 and the MD layer 430 and extends in the X direction. The MD strip 430b is connected to the M0 strip 440a through an MD via (i.e., VD) 450a (collectively 450). As such, the M0 strip 440a serves as the metal strip for the bit line signal BL0, in this example. It should be noted, other M0 strips, which are not shown in FIG. 4 for simplicity, may be utilized to serve as the metal strips for other signals such as WLP0, WLR0, WLR1, and WLP1.

Now referring to FIG. 5, the schematic diagram of the OTP memory cells 102a and 102b of FIG. 3 illustrates the functionality of the MD vacancy locations 460a and 460b. In the example of FIG. 5, the MD strip 430b is connected to the M0 strip 440a through the VD 450a. The MD strip 430a is located between the MG strips 420a and 420b; the MD strip 430c is located between the MG strips 420c and 420d. In a conventional structure, there are MD strips at the MD vacancy locations 460a and 460b. Because the first terminal 203a of the antifuse transistor 202a and the first terminal 203b of the antifuse transistor 202b are floating terminals, the MG strip 420a and the MG strip 420d are very likely to be in contact with the are MD strips that are otherwise disposed at the MD vacancy locations 460a and 460b. In contrast, in the example of FIG. 5, there are no MD strips disposed at the MD vacancy locations 460a and 460b, therefore eliminating the likelihood of having an MD-MG short. In summary, the vacancy terminals 203a and 203b can reduce undesired large leakage current.

Figure 6:
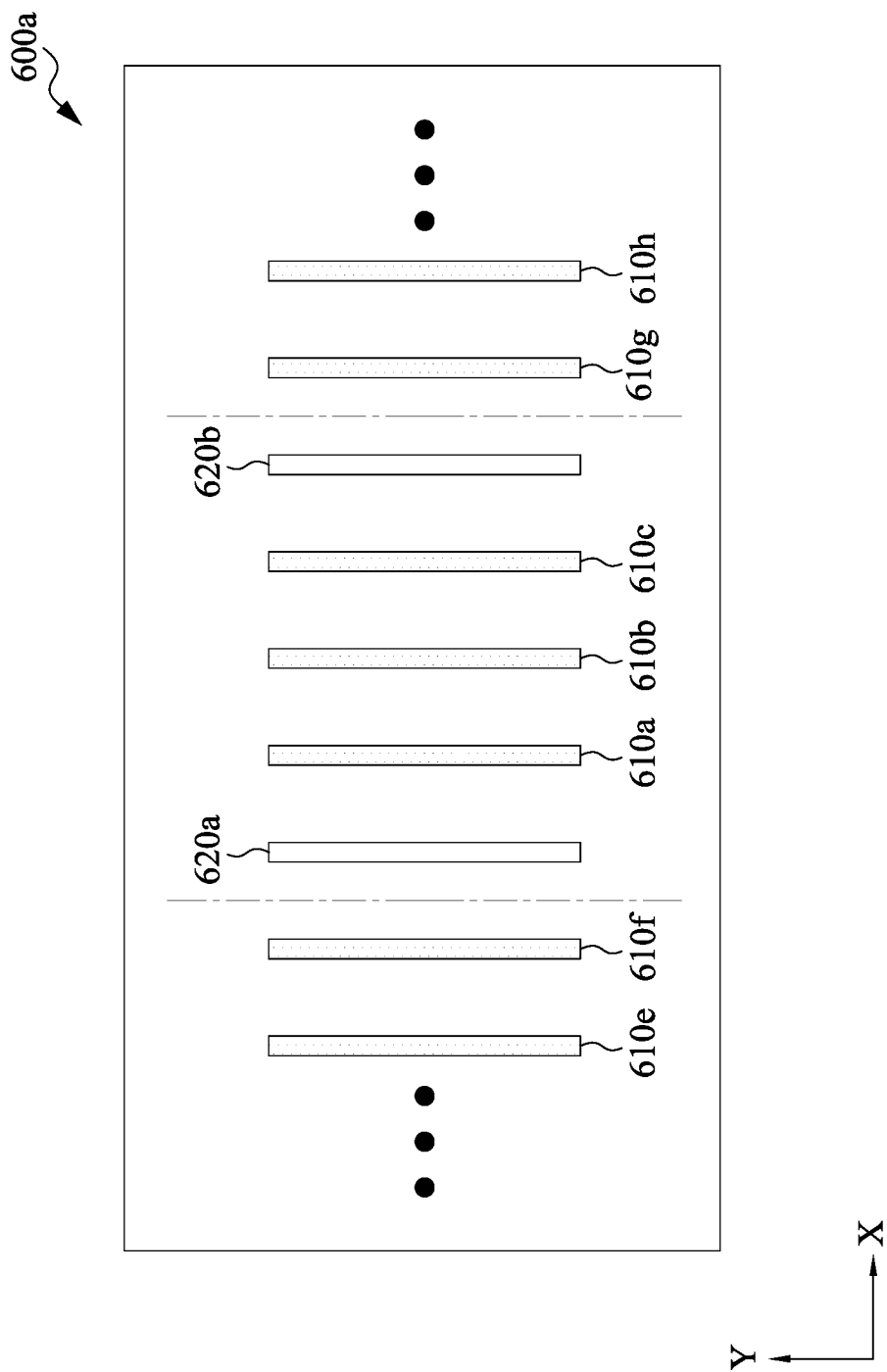
FIG. 6 is a diagram of an MD layer mask corresponding to the layout of FIG. 4 in accordance with some embodiments.

FIG. 6 is a diagram of an MD layer mask 600a corresponding to the layout of FIG. 4 in accordance with some embodiments. In the example of FIG. 6, the MD layer mask 600a includes MD patterns 610a, 610b, and 610c that extend in the Y direction and correspond to the MD strips 430a, 430b, 430c, respectively. The MD layer mask 600a may also include MD patterns 610e, 610f, 610g, and 610h outside the OTP memory cell 102a and 102b. As noted in the discussion of FIG. 4 above, the first terminal 203a of the antifuse transistor 202a and the first terminal 203b of the antifuse transistor 202b are vacancy terminals rather than floating terminals. As such, there are no MD strips disposed at the MD vacancy locations 460a and 460b, which eliminates the risk of having an MD-MG short. Thus, the MD layer mask 600a shown in FIG. 6 further includes two MD pattern vacancy locations 620a and 620b corresponding to the MD vacancy positions 460a and 460b of FIG. 4. In other words, unlike in the conventional structure, there are no MD patterns at the MD pattern vacancy locations 620a and 620b. Fabricating the antifuse transistors 202a and 202b using the mask 600a thus results in no MD strips being formed at vacancy terminals 460a and 460b of the antifuse transistors 202a and 202b.

Figure 7:
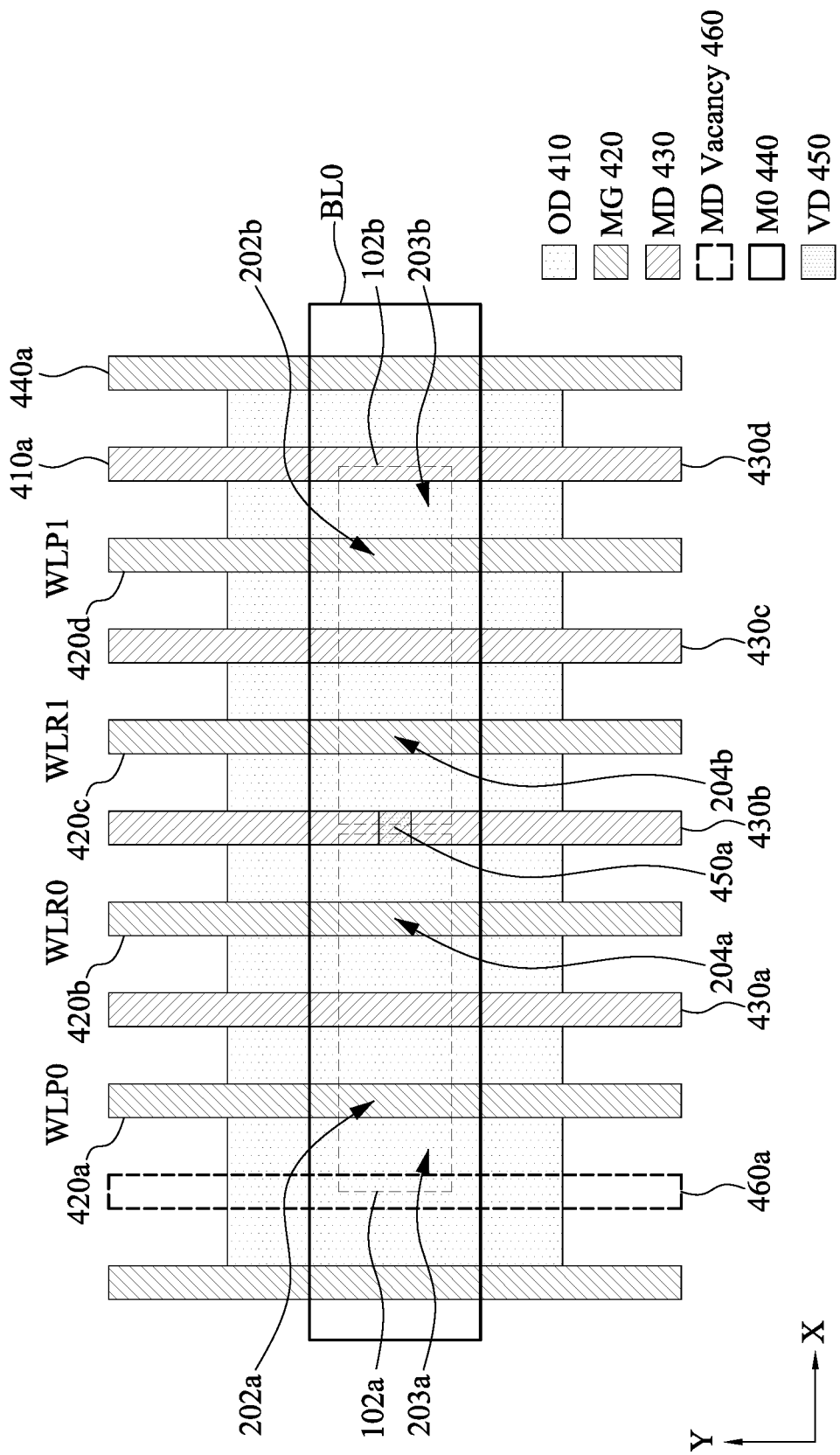
FIG. 7 is a layout diagram of the OTP memory cells in accordance with some embodiments.
Figure 8:
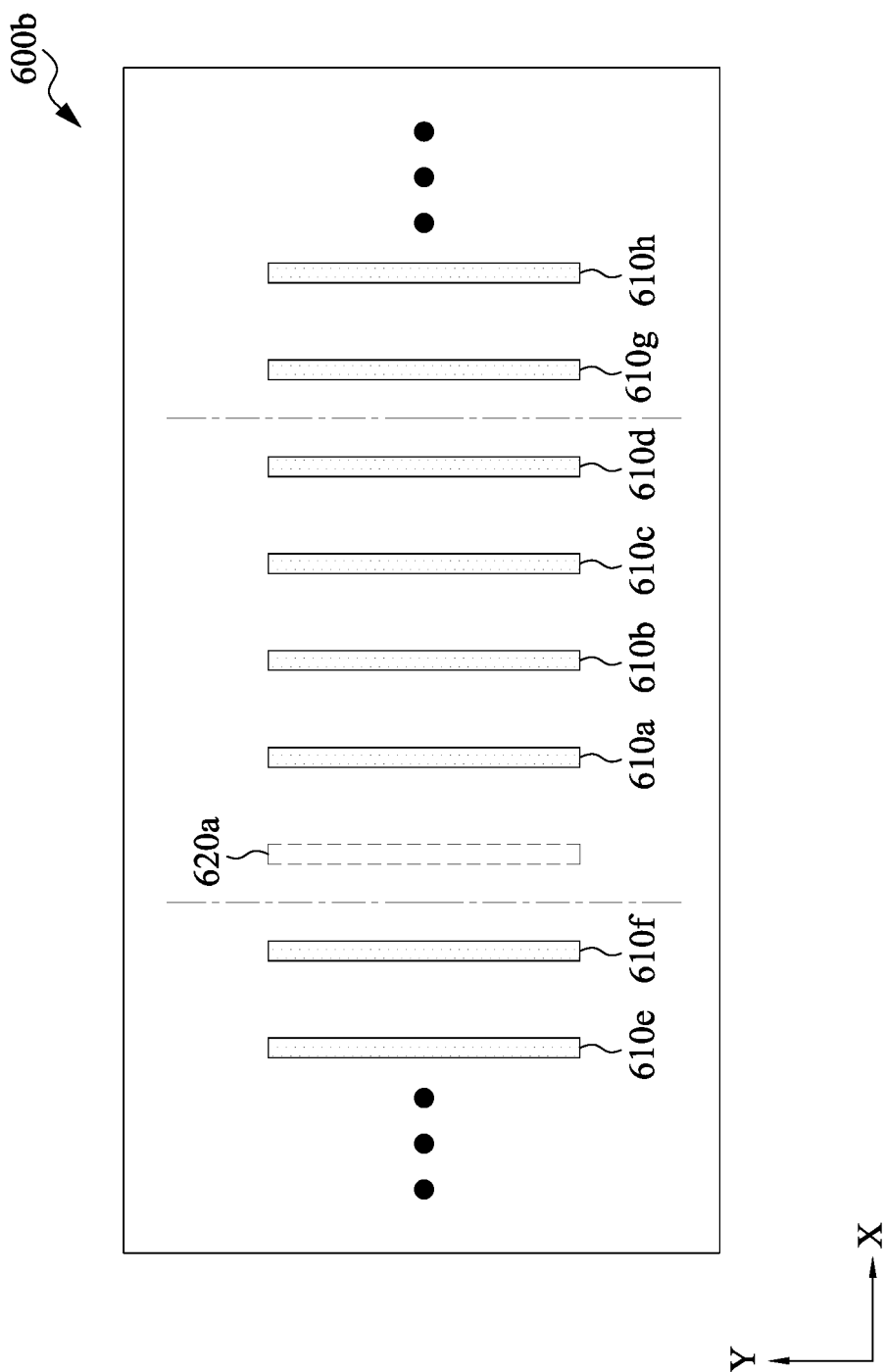
FIG. 8 is a diagram of an MD layer mask 600b corresponding to the layout of FIG. 7 in accordance with some embodiments.

FIG. 7 is a layout diagram of the OTP memory cells 102a and 102b in accordance with some embodiments. FIG. 8 is a diagram of an MD layer mask 600b corresponding to the layout of FIG. 7 in accordance with some embodiments. The layout of FIG. 7 is essentially the same as that of FIG. 4, except that only one of the two antifuse transistors has a vacancy terminal. Structures in FIG. 7 that are essentially the same as their counterparts in FIG. 4 are not repeated for simplicity.

In the example of FIG. 7, the first terminal 203a of the antifuse transistor 202a is a vacancy terminal, whereas the first terminal 203b of the antifuse transistor 202b is a floating terminal. Accordingly, an MD vacancy location 460 is located to the left of MG strip 420a, whereas an MD strip 430 is disposed to the right of the MG strip 420. In other words, only a portion (half in this example of FIG. 7) of the OTP memory cells have antifuse transistors with vacancy terminals. It should be noted that, in another example, the antifuse transistor 202a may have a floating terminal while the antifuse transistor 202b may have a vacancy terminal.

Referring to FIG. 8, the MD layer mask 600b includes MD patterns 610a, 610b, 610c, and 610d that extend in the Y direction and correspond to the MD strips 430a, 430b, 430c, and 430d, respectively. The MD layer mask 600b may also include MD patterns 610e, 610f, 610g, and 610h outside the OTP memory cell 102a and 102b. As noted in the discussion of FIG. 7 above, the first terminal 203a of the antifuse transistor 202a is a vacancy terminal rather than a floating terminal. As such, there is no MD strip disposed at the MD vacancy location 460a, which eliminates the risk of having an MD-MG short. Thus, the MD layer mask 600b further includes one MD pattern vacancy location 620a corresponding to the MD vacancy position 460a of FIG. 7. In other words, unlike in the conventional structure, there is no MD pattern at the MD pattern vacancy location 620a. Fabricating the antifuse transistor 202a using the mask 600b thus results in no MD strip being formed at the vacancy terminals 460a of the antifuse transistor 202a.

Figure 9:
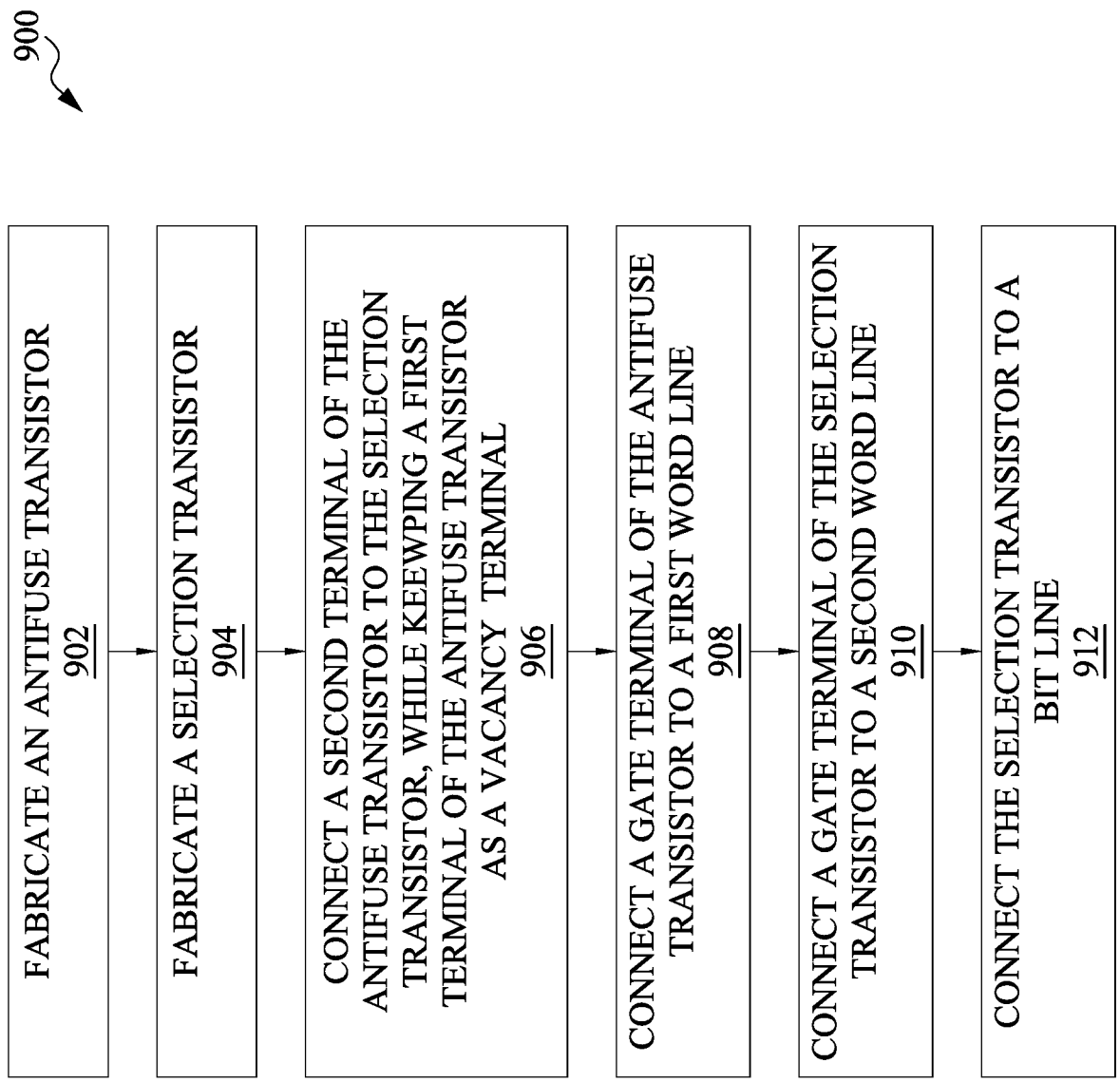
FIG. 9 is a flowchart diagram illustrating an example method of fabricating an OTP memory cell in accordance with some embodiments.

FIG. 9 is a flowchart diagram illustrating an example method 900 of fabricating an OTP memory cell in accordance with some embodiments. In the example of FIG. 9, the method 900 includes operations 902, 904, 906, 908, 910, and 912. It should be noted that the method 900 may include other operations as needed.

At operation 902, an antifuse transistor (e.g., the antifuse transistor 202 of FIG. 2) is fabricated. At operation 904, a selection transistor (e.g., the selection transistor 204 of FIG. 2) is fabricated. At operation 906, a second terminal of the antifuse transistor is connected to the selection transistor, while a first terminal of the antifuse transistor (e.g., the first terminal 203 of FIG. 2) is kept as a vacancy terminal. The vacancy terminal is a terminal that does not have a source contact structure or a drain contact structure. In one implementation, the vacancy terminal is fabricated using a metal-over-diffusion (MD) layer mask that does not include an MD pattern at the vacancy terminal as discussed in conjunction with FIGS. 6 and 8 above. More particularly, the antifuse transistors may be fabricated using an MD layer mask such as the mask 600a shown in FIG. 6 or the mask 600b shown in FIG. 8, that include MD pattern vacancy locations corresponding to the vacancy terminal positions, such that no MD strips are formed over the OD at the vacancy terminal locations 460a and 460b. In other words, unlike in the conventional structure, there are no MD strips over the locations corresponding to the vacancy terminals.

At operation 908, a gate terminal of the antifuse transistor is connected to a first word line (e.g., the word line 106P of FIG. 2). The antifuse transistor is selectable between a first state and a second state in response to a first signal (e.g., WLP of FIG. 2) on the first word line. In one example, the first state is a low resistance state and the second state is a high resistance state. In one example, the antifuse transistor has a permanent electrically conductive path associated with the first state.

At operation 910, a gate terminal of the selection transistor is connected to a second word line (e.g., the word line 106 of FIG. 2). The selection transistor is configured to provide access to the antifuse transistor in response to a second signal (e.g., WLR of FIG. 2) on the second word line. At operation 912, the selection transistor is connected to a bit line (e.g., the bit line 112 of FIG. 2).

It should be noted that an OTP memory array and a memory device that include the OTP memory cell fabricated using the example method 900 may be fabricated accordingly based on the example 900.

In one aspect, an OTP memory cell is provided. The OTP memory cell includes: an antifuse transistor, wherein a gate terminal of the antifuse transistor is connected to a first word line having a first signal, and the antifuse transistor is selectable between a first state and a second state in response to the first signal; and a selection transistor connected between the antifuse transistor and a bit line, wherein a gate terminal of the selection transistor is connected to a second word line having a second signal, and the selection transistor is configured to provide access to the antifuse transistor in response to the second signal. A first terminal of the antifuse transistor is a vacancy terminal, and a second terminal of the antifuse transistor is connected to the selection transistor.

In another aspect, an OTP memory array is provided. The OTP memory array includes a plurality of OTP memory cells arranged in a plurality of columns and a plurality of rows. Each OTP memory cell includes: an antifuse transistor, wherein a gate terminal of the antifuse transistor is connected to a first word line having a first signal, and the antifuse transistor is selectable between a first state and a second state in response to the first signal; and a selection transistor connected between the antifuse transistor and a bit line, wherein a gate terminal of the selection transistor is connected to a second word line having a second signal, and the selection transistor is configured to provide access to the antifuse transistor in response to the second signal. The antifuse transistor of at least one of the plurality of OTP memory cells has a first terminal that is a vacancy terminal and a second terminal that is connected to the selection transistor.

In yet another aspect, a method of fabricating an OTP memory cell is provided. The method comprises the following steps: fabricating an antifuse transistor, wherein a first terminal of the antifuse transistor is a vacancy terminal; fabricating a selection transistor; connecting a second terminal of the antifuse transistor to the selection transistor; connecting a gate terminal of the antifuse transistor to a first word line configured to receive a first signal, wherein the antifuse transistor is selectable between a first state and a second state in response to the first signal; connecting a gate terminal of the selection transistor to a second word line configured to receive a second signal, wherein the selection transistor is configured to provide access to the antifuse transistor in response to the second signal; and connecting the selection transistor to a bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time programmable (OTP) memory cell system, comprising:
   a first antifuse transistor, wherein a gate terminal of the first antifuse transistor is connected to a first word line configured to receive a first signal, and the first antifuse transistor is selectable between a first state and a second state in response to the first signal;
   a first selection transistor connected between the first antifuse transistor and a bit line, wherein a gate terminal of the first selection transistor is connected to a second word line configured to receive a second signal, and the first selection transistor is configured to provide access to the first antifuse transistor in response to the second signal;
   a second antifuse transistor, wherein a gate terminal of the second antifuse transistor is connected to a third word line configured to receive a third signal, and the second antifuse transistor is selectable between the first state and the second state in response to the third signal; and
   a second selection transistor connected between the second antifuse transistor and the bit line, wherein a gate terminal of the second selection transistor is connected to a forth word line configured to receive a third signal, and the second selection transistor is configured to provide access to the second antifuse transistor in response to the fourth signal;
   wherein:
   a first terminal of the first antifuse transistor is a vacancy terminal, and a second terminal of the first antifuse transistor is connected to the first selection transistor, and
   a first terminal of the second antifuse transistor is a floating terminal including a contact structure, and a second terminal of the second antifuse transistor is connected to the second selection transistor.

2. The OTP memory cell system of claim 1, wherein the vacancy terminal is a terminal that does not have a source contact structure or a drain contact structure.

3. The OTP memory cell system of claim 1, further comprising an active region, wherein the second terminal of the first antifuse transistor includes a metal-over-diffusion (MD) strip disposed over the active region, and wherein there is no MD strip disposed over the active region at the vacancy terminal.

4. The OTP memory cell system of claim 1, wherein the first state is a low resistance state and the second state is a high resistance state.

5. The OTP memory cell system of claim 4, wherein the first antifuse transistor and the second antifuse transistor have a permanent electrically conductive path associated with the first state.

6. The OTP memory cell system of claim 1, wherein a first thickness of a gate dielectric layer of the first antifuse transistor is lower than a second thickness of a gate dielectric layer of the first selection transistor.

7. The OTP memory cell system of claim 1, wherein the first antifuse transistor is n-type.

8. The OTP memory cell system of claim 1, wherein the first antifuse transistor is p-type.

9. A one-time programmable (OTP) memory array, comprising:
   a plurality of OTP memory cells arranged in a plurality of columns and a plurality of rows, each OTP memory cell comprising:
      an antifuse transistor, wherein a gate terminal of the antifuse transistor is connected to a first word line configured to receive a first signal, and the antifuse transistor is selectable between a first state and a second state in response to the first signal; and
      a selection transistor connected between the antifuse transistor and a bit line, wherein a gate terminal of the selection transistor is connected to a second word line configured to receive a second signal, and the selection transistor is configured to provide access to the antifuse transistor in response to the second signal;
   wherein a first OTP memory cell and a second OTP memory cell of the plurality of OTP memory cells are arranged in a first row of the plurality of rows, wherein the selection transistor of the first OTP memory cell is connected to the selection transistor of the second OTP memory cell;
   the antifuse transistor of the first OTP memory cell has a first terminal that is a vacancy terminal and a second terminal that is connected to the selection transistor of the first OTP memory cell, and
   the antifuse transistor of the second OTP memory cell has a third terminal that is a floating terminal including a contact structure and a fourth terminal that is connected to the selection transistor of the second OTP memory cell.

10. The OTP memory array of claim 9,
   wherein a third OTP memory cell and a fourth OTP memory cell of the plurality of OTP memory cells are arranged in a second row of the plurality of rows, wherein the selection transistor of the third OTP memory cell is connected to the selection transistor of the fourth OTP memory cell;
   the antifuse transistor of the third OTP memory cell has a first terminal that is a vacancy terminal and a second terminal that is connected to the selection transistor of the third OTP memory cell, and
   the antifuse transistor of the fourth OTP memory cell has a third terminal that is a floating terminal including a contact structure and a fourth terminal that is connected to the selection transistor of the fourth OTP memory cell.

11. The OTP memory array of claim 9, wherein the plurality of columns include a first column and a second column, and wherein the antifuse transistor of each OTP memory cell in the first column has the first terminal that is the vacancy terminal and the second terminal that is connected to the selection transistor.

12. The OTP memory array of claim 11, wherein the OTP memory cells in each of the plurality of rows share a common bit line.

13. The OTP memory array of claim 9, wherein the plurality of columns include a first column and a second column, and the antifuse transistor of each OTP memory cell in the second column has the first terminal that is the vacancy terminal and the second terminal that is connected to the selection transistor.

14. The OTP memory array of claim 9, wherein the vacancy terminal is a terminal that does not have a source contact structure or a drain contact structure.

15. The OTP memory array of claim 9, further comprising an active region, wherein the second terminal of the antifuse transistor of the first OTP memory cell includes a metal-over-diffusion (MD) strip disposed over the active region, and wherein there is no MD strip disposed over the active region at the vacancy terminal.

16. The OTP memory array of claim 9, wherein a first thickness of a gate dielectric layer of the antifuse transistor of the first OTP memory cell is lower than a second thickness of a gate dielectric layer of the selection transistor of the first OTP memory cell.

17. A method of fabricating one-time programmable (OTP) memory cells, comprising:
fabricating a first antifuse transistor, wherein a first terminal of the first antifuse transistor is a vacancy terminal;
fabricating a first selection transistor;
fabricating a second antifuse transistor, wherein a first terminal of the second antifuse transistor is a floating terminal including a contact structure;
fabricating a second selection transistor;
connecting a second terminal of the first antifuse transistor to the first selection transistor;
connecting a second terminal of the second antifuse transistor to the second selection transistor;
connecting a gate terminal of the first antifuse transistor to a first word line configured to receive a first signal, wherein the first antifuse transistor is selectable between a first state and a second state in response to the first signal;
connecting a gate terminal of the first selection transistor to a second word line configured to receive a second signal, wherein the first selection transistor is configured to provide access to the first antifuse transistor in response to the second signal;
connecting a gate terminal of the second antifuse transistor to a third word line configured to receive a third signal, wherein the second antifuse transistor is selectable between the first state and the second state in response to the third signal;
connecting a gate terminal of the second selection transistor to a fourth word line configured to receive a fourth signal, wherein the second selection transistor is configured to provide access to the antifuse transistor in response to the fourth signal; and
connecting the first selection transistor and the second selection transistor to a bit line.

18. The method of claim 17, wherein the fabricating the first antifuse transistor comprises:
fabricating a metal-over-diffusion (MD) structure for the first antifuse transistor that does not include an MD pattern at the vacancy terminal.

19. The method of claim 17, wherein the fabricating the first antifuse transistor comprises:
refraining from fabricating a source contact structure or a drain contact structure at the first terminal of the first antifuse transistor.

20. The method of claim 17, wherein a first thickness of a gate dielectric layer of the first antifuse transistor is lower than a second thickness of a gate dielectric layer of the first selection transistor.

* * * * *